United States Patent
Kwon et al.

(10) Patent No.: US 10,134,970 B2
(45) Date of Patent: Nov. 20, 2018

(54) COMPOUND SEMICONDUCTOR AND APPLICATION THEREOF

(71) Applicant: LG CHEM, LTD., Seoul (KR)

(72) Inventors: O-Jong Kwon, Daejeon (KR);
Tae-Hoon Kim, Daejeon (KR);
Cheol-Hee Park, Daejeon (KR);
Kyung-Moon Ko, Daejeon (KR)

(73) Assignee: LG CHEM, LTD., Seoul (KR)

( * ) Notice: Subject to any disclaimer, the term of this patent is extended or adjusted under 35 U.S.C. 154(b) by 164 days.

(21) Appl. No.: 15/039,020

(22) PCT Filed: Nov. 28, 2014

(86) PCT No.: PCT/KR2014/011587
§ 371 (c)(1),
(2) Date: May 24, 2016

(87) PCT Pub. No.: WO2015/080527
PCT Pub. Date: Jun. 4, 2015

(65) Prior Publication Data
US 2017/0170379 A1 Jun. 15, 2017

(30) Foreign Application Priority Data

Nov. 29, 2013 (KR) .................. 10-2013-0147674

(51) Int. Cl.
| | |
|---|---|
| *H01L 35/18* | (2006.01) |
| *H01L 31/04* | (2014.01) |
| *H01L 31/18* | (2006.01) |
| *H01L 31/032* | (2006.01) |
| *C01B 19/00* | (2006.01) |
| *H01L 35/16* | (2006.01) |

(52) U.S. Cl.
CPC ............ *H01L 35/18* (2013.01); *C01B 19/002* (2013.01); *H01L 31/032* (2013.01); *H01L 35/16* (2013.01); *C01P 2004/60* (2013.01); *C01P 2006/40* (2013.01)

(58) Field of Classification Search
CPC ........ H01L 35/16; H01L 35/18; H01L 31/032
See application file for complete search history.

(56) References Cited

U.S. PATENT DOCUMENTS

| | | | | |
|---|---|---|---|---|
| 8,226,843 B2* | 7/2012 | Park | ................. | C09K 11/881 |
| | | | | 136/240 |
| 8,333,912 B2* | 12/2012 | Chen | ................. | B82Y 30/00 |
| | | | | 136/200 |
| 8,394,284 B2* | 3/2013 | Murai | ................. | B22F 1/025 |
| | | | | 136/200 |
| 9,561,959 B2* | 2/2017 | Kwon | ................. | H01L 35/16 |
| 2003/0110892 A1 | 6/2003 | Nicoloau | | |
| 2009/0184295 A1 | 7/2009 | Yamaguchi et al. | | |
| 2013/0125962 A1 | 5/2013 | Lu et al. | | |
| 2013/0140507 A1* | 6/2013 | Rowe | ................. | B82Y 30/00 |
| | | | | 252/519.13 |
| 2013/0298954 A1 | 11/2013 | Ahn et al. | | |

FOREIGN PATENT DOCUMENTS

| | | |
|---|---|---|
| EP | 1 291 927 A2 | 3/2003 |
| EP | 2320485 * | 1/2011 |
| EP | 2 320 485 A2 | 5/2011 |
| KR | 10-1128304 B1 | 3/2012 |
| WO | WO 2012/138930 A2 | 10/2012 |

OTHER PUBLICATIONS

A.P. Richard et al., "Synthesis, structure, and optical properties of BiCuOCh (Ch=S, Se, and Te)", Journal of Solid State Chemistry, 2012, pp. 15-19, vol. 187, Elsevier Inc.
International Search Report for International Patent Application No. PCT/KR2014/011587 filed Nov. 28, 2014.

* cited by examiner

*Primary Examiner* — C Melissa Koslow

(57) ABSTRACT

In the present disclosure, disclosed are a novel compound semiconductor which can be used as a thermoelectric material or the like, and applications thereof. A compound semiconductor according to the present disclosure can be represented by the following chemical formula 1: <Chemical formula 1>$[Bi_{1-x}M_xCu_{u-w}T_wO_{a-y}Q1_yTe_bSe_z]A_c$, where, in the chemical formula 1, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x < 1$, $0.5 \leq u \leq 1.5$, $0 \leq w \leq 1$, $0.2 < a < 1.5$, $0 \leq y < 1.5$, $0 \leq b < 1.5$, $0 \leq z < 1.5$ and $0 < c < 0.2$.

10 Claims, 6 Drawing Sheets

… …

COMPOUND SEMICONDUCTOR AND APPLICATION THEREOF

TECHNICAL FIELD

The present application is a National Stage of International Patent Application No. PCT/KR2014/011587, filed on Nov. 28, 2014, which claims the benefit of Korean Patent Application No. 10-2013-0147674 filed on Nov. 29, 2013 with the Korean Intellectual Property Office, the disclosures of which are incorporated herein by reference in their entirety.

The present disclosure relates to a novel compound semiconductor, which can be used in various applications such as thermoelectric materials or solar cells, and applications thereof.

BACKGROUND ART

Compound semiconductors are compounds which act as a semiconductor by a combination of two or more elements, rather than by single elements like silicon or germanium. Currently, a variety of such compound semiconductors have been developed and are being used in various applications. Typically, compound semiconductors may be used in thermoelectric conversion devices using the Peltier effect, light emitting devices (such as light emitting diodes and laser diodes) and solar cells using the photoelectric conversion effect, and the like.

First, solar cells are being researched actively as an alternative energy source for the future because they need no additional energy sources other than solar light, which exists naturally and is thus eco-friendly. Solar cells can be classified into silicon solar cells using single elements (mainly, silicon), compound semiconductor solar cells using compound semiconductors, tandem solar cells in which two or more solar cells having a different bandgap energy are stacked, and the like.

Among them, compound semiconductor solar cells use compound semiconductors in a light absorbing layer which absorbs solar light to generate electron-hole pairs; especially, such compound semiconductors may be III-V group compound semiconductors such as GaAs, InP, GaAlAs and GaInAs, II-VI group compound semiconductors such as CdS, CdTe and ZnS, and compound semiconductors typically represented by $CuInSe_2$.

A light absorbing layer in solar cells needs to exhibit superior long-term electric and optical stability and high photoelectric conversion efficiency, and to allow for ease adjustment of bandgap energy and conductive type through compositional changes or doping. A light absorbing layer also needs to satisfy other requirements such as manufacturing costs and yields in order to be commercialized. However, conventional chemical semiconductors have failed to meet all such requirements at once.

Also, thermoelectric conversion devices can be applied in thermoelectric conversion power generation, thermoelectric conversion cooling and the like, and are generally made up of n-type thermoelectric semiconductors and p-type thermoelectric semiconductors, with both being connected electrically in serial and thermally in parallel. Among them, thermoelectric conversion power generation uses thermal electromotive force generated by maintaining a temperature difference in a thermoelectric conversion device, converting thermal energy into electric energy. And thermoelectric conversion cooling uses the effect of a temperature difference being generated at opposite ends of a thermoelectric conversion device by flowing a direct current through the opposite ends, converting electric energy into thermal energy.

The energy conversion efficiency of such thermoelectric conversion devices can depend broadly on a figure of merit of thermoelectric conversion devices, which is ZT. Here, ZT can be determined by Seebeck coefficient, electrical conductivity, thermal conductivity and the like; a higher ZT means a thermoelectric conversion material having higher performance.

Though numerous thermoelectric conversion materials have been suggested so far, thermoelectric conversion materials with high thermoelectric conversion performance have yet to be arranged adequately. Especially, applications for thermoelectric conversion materials are gradually being widened in recent years, and temperature conditions can differ depending on such applications. However, since thermoelectric conversion materials may exhibit different thermoelectric conversion performance depending on temperature, it is necessary that thermoelectric conversion performance of given thermoelectric conversion materials should be optimized for the applications in which they are applied. Still, thermoelectric conversion materials have yet to be arranged adequately to have performance optimized for various ranges of temperature.

DISCLOSURE

Technical Problem

Therefore, the present disclosure have been designed to solve the foregoing problems, and the objective of the present disclosure is to provide: a compound semiconductor material which can be used in various applications, such as thermoelectric conversion material in thermoelectric conversion devices and solar cells, and exhibit superior thermoelectric conversion performance; a method of manufacturing the same; and a thermoelectric conversion device and a solar cell using the same.

The other objectives and advantages of the present disclosure can be understood with the following description and more clearly with the embodiments of the present disclosure. Also, it should easily be understood that the other objectives and advantages of the present disclosure can be implemented by the means described in the claims and the combinations thereof

Technical Solution

In order to achieve the foregoing objectives, the inventors have gone through continuous research, successfully synthesizing compound semiconductors represented by the following chemical formula 1, and completing the present disclosure by identifying that such compound semiconductors can be used in thermoelectric conversion materials in thermoelectric conversion devices, light absorbing layers in solar cells, or the like.

$$[Bi_{1-x}M_xCu_{u-w}T_wO_{a-y}Q1_yTe_bSe_z]A_c \qquad \text{<Chemical formula 1>}$$

Where, in the chemical formula 1, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x < 1$, $0.5 \leq u \leq 1.5$, $0 \leq w \leq 1$, $0.2 < a < 1.5$, $0 \leq y < 1.5$, $0 \leq b < 1.5$, $0 \leq z < 1.5$ and $0 < c < 0.2$.

Preferably, in the chemical formula 1, c satisfies $0 < c < 0.0.5$.

Also preferably, A is one or more elements selected from the group consisting of Ag, Co, Ni, Zn, Au, Pd, Pt, $Ag_2Te$, $CuTe$, $Cu_2Se$, $Bi_2Te_3$ and CuAgSe.

Also preferably, in the chemical formula 1, x, y and z respectively satisfy $x=0$, $y=0$ and $z=0$.

Also preferably, the chemical formula 1 is represented by $[BiCuOTe]A_c$.

Also preferably, in the chemical formula 1, w, y, b and z respectively satisfy $w=0$, $y=0$, $b=0$ and $z=1$.

Also preferably, the chemical formula 1 is represented by $[Bi_{1-x}M_xCuOSe]A_c$.

In order to achieve the foregoing objectives, a compound semiconductor according to one aspect of the present disclosure is a compound semiconductor in which A particles are distributed randomly in a compound represented by $Bi_{1-x}M_xCu_{u-w}T_wO_{a-y}Q1_yTe_bSe_z$, wherein M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x < 1$, $0.5 \leq u \leq 1.5$, $0 \leq w \leq 1$, $0.2 < a < 1.5$, $0 \leq y < 1.5$, $0 \leq b < 1.5$ and $0 \leq z < 1.5$.

Also, in order to achieve the foregoing objectives, a method of manufacturing a compound semiconductor according to one aspect of the present disclosure comprises the steps of: preparing a material represented by $Bi_{1-x}M_xCu_{u-w}T_wO_{a-y}Q1_yTe_bSe_z$; producing a mixture by adding A to the prepared material; and sintering the mixture.

Preferably, the step of preparing a material represented by $Bi_{1-x}M_xCu_{u-w}T_wO_{a-y}Q1_yTe_bSe_z$ mixes powders of $Bi_2O_3$, Bi, Cu and T and optionally further mixes one or more powders selected from the group consisting of M, Q1, Te and Se, and then performs thermal treatment.

Also preferably, the step of producing a mixture adds 20 mol % or less of A in comparison to $Bi_{1-x}M_xCu_{u-w}T_wO_{a-y}Q1_yTe_bSe_z$.

Also preferably, the step of producing a mixture adds 5 mol % or less of A in comparison to $Bi_{1-x}M_xCu_{u-w}T_wO_{a-y}Q1_yTe_bSe_z$.

Also preferably, the step of producing a mixture adds A having a particle size of 5 nm to 100 um.

Also preferably, the step of sintering a mixture is performed by a spark plasma sintering method or a hot pressing method.

In order to achieve the foregoing objectives, a method of manufacturing a compound semiconductors according to another aspect of the present disclosure comprises the steps of: mixing powders of $Bi_2O_3$, Bi, Cu, T and A, and optionally further mixing powders of at least one of M, Q1, Te and Se; and sintering the mixture.

In order to achieve the foregoing objectives, a thermoelectric conversion device according to the present disclosure comprises a compound semiconductor described above.

In order to achieve the foregoing objectives, a solar cell according to the present disclosure comprises a compound semiconductor described above.

In order to achieve the foregoing objectives, a bulk-type thermoelectric material according to the present disclosure comprises a compound semiconductor described above.

Advantageous Effects

The present disclosure gives the following effects. According to the present disclosure, provided is a compound semiconductor material which can be used as thermoelectric conversion devices, solar cells and the like.

Especially, a compound semiconductor according to the present disclosure can substitute for conventional compound semiconductors or can be used as another material in addition to conventional compound semiconductors.

Also, according to one aspect of the present disclosure, a compound semiconductor can be used as a thermoelectric conversion material for thermoelectric conversion devices. In this case, high ZT can be ensured to manufacture thermoelectric conversion devices with superior thermoelectric conversion performance. Furthermore, a thermoelectric conversion material can be provided with high ZT within the range of 100° C. to 600° C., and can thus be applied more suitably in thermoelectric conversion devices for mid-to-high temperature.

Especially, a compound semiconductor according to the present disclosure can be used as a p-type thermoelectric conversion material.

Also, according to another aspect of the present disclosure, a compound semiconductor can be used in solar cells. Especially, a compound semiconductor according to the present disclosure can be used as a light absorbing layer in solar cells.

In addition, according to another aspect of the present disclosure, a compound semiconductor can be used in infrared (IR) windows or IR sensors optionally allowing infrared to pass, magnetic devices, memory or the like.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Figure 1:
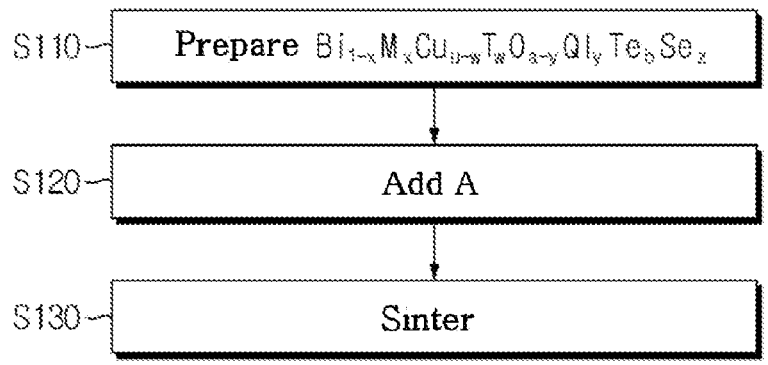
FIG. 1 is a schematic flowchart for a method of manufacturing a compound semiconductor according to one aspect of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

MODE FOR DISCLOSURE

According to the present disclosure, provided is a novel compound semiconductor represented by the following chemical formula 1.

$[Bi_{1-x}M_xCu_{u-w}T_wO_{a-y}Q1_yTe_bSe_z]A_c$  <Chemical formula 1>

Where, in the chemical formula 1, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x < 1$, $0.5 \leq u \leq 1.5$, $0 \leq w \leq 1$, $0.2 < a < 1.5$, $0 \leq y < 1.5$, $0 \leq b < 1.5$, $0 \leq z < 1.5$ and $0 < c < 0.2$.

Preferably, in the chemical formula 1, A can include transition metal and/or transition metal-Group VI compounds which, when being placed with in a matrix of $[Bi_{1-x}M_xCu_{u-w}T_wO_{a-y}Q1_yTe_bSe_z]$, exhibit thermodynamical stability in phase and form, lower the lattice thermal conductivity of the matrix and have electrical conductivity higher than the matrix. Also, in the chemical formula 1, A can include transition metals which can induce the generation of transition metal-Group VI element compounds having such characteristics within a matrix of $[Bi_{1-x}M_x Cu_{u-w}T_wO_{a-y}Q1_yTe_bSe_z]$. For example, in the chemical formula 1, A includes one or more elements selected from the group consisting of Ag, Co, Ni, Zn, Au, Pd, Pt, $Ag_2Te$, CuTe, $Cu_2Se$, $Bi_2Te_3$ and CuAgSe.

Preferably, in the chemical formula 1, c is $0 < c < 0.05$.

Especially, a compound semiconductor according to the present disclosure further comprises one or more materials selected from the group consisting of transition metals and transition metal-Group VI element compounds, including Ag, Co, Ni, Zn, Au, Pd, Pt, $Ag_2Te$, CuTe, $Cu_2Se$, $Bi_2Te_3$, and CuAgSe, in addition to a material represented by $Bi_{1-x}M_xCu_{u-w}T_wO_{a-y}Q1_yTe_bSe_z$. And such arrangements allow a compound semiconductor according to the present disclosure to be used as a thermoelectric conversion material with superior thermoelectric conversion performance.

Preferably, in the chemical formula 1, x, y and z can satisfy x=0, y=0 and z=0. In this case, the chemical formula 1 can be represented by the following chemical formula:

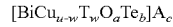
$[BiCu_{u-w}T_wO_aTe_b]A_c$

More preferably, in the chemical formula, u, w, a and b satisfy u=1, w=0, a=1 and b=1 respectively. In this case, the chemical formula 1 can be represented by the following chemical formula:

$[BiCuOTe]A_c$

Also preferably, in the chemical formula 1, w, y, b and z can satisfy w=0, y=0, b=0 and z=1 respectively. In this case, the chemical formula 1 can be represented by the following chemical formula:

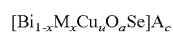
$[Bi_{1-x}M_xCu_uO_aSe]A_c$

More preferably, in the chemical formula, u and a can satisfy u=1 and a=1. In this case, the chemical formula 1 can be represented by the following chemical formula:

$[Bi_{1-x}M_xCuOSe]A_c$

Also preferably, in the chemical formula 1, u and w can satisfy the condition of $0.5 \leq u - w \leq 1.5$.

A compound semiconductor according to the present disclosure as described above can be formed as a structure comprising one or more particles among transition metals and transition metal-Group VI element compounds, such as Ag, Co, Ni, Zn, Au, Pd, Pt, $Ag_2Te$, CuTe, $Cu_2Se$, $Bi_2Te_3$ and CuAgSe, in BiCuOTe-based material or BiCuOSe-based material. And due to such characteristic arrangements, a compound semiconductor according to the present disclosure can have a boundary surface causing phonon scattering between a matrix and particles, thereby exhibiting lower thermal conductivity compared to compound semiconductors comprising BiCuOTe or $Bi_{1-x}M_xCuOSe$ only. And at the same time, particles of transition metals or transition metal-Group VI element compounds can exhibit high electrical conductivity by introducing charges into a matrix of $Bi_{1-x}M_xCu_{u-w}T_wO_{a-y}Q1_yTe_bSe_z$. Also, carrier filtering effect can be produced on a boundary surface between a matrix and particles, due to difference in energy bandgap and Fermi energy, thereby exhibiting enhanced Seebeck coefficient characteristics of compound semiconductors. A compound semiconductor according to the present disclosure can exhibit high ZT due to a combination of the effects described above and thus provide thermoelectric conversion performance enhanced effectively.

On the other hand, a compound semiconductor according to the present disclosure can further comprise doped $Bi_2Te_3$ and $Cu_2Se$ as A, in addition to Ag, Co, Ni, Zn, Au, Pd, Pt, $Ag_2Te$, CuTe, $Cu_2Se$, $Bi_2Te_3$ and CuAgSe.

Also, a compound semiconductor according to the present disclosure is a compound semiconductor in which A particles are distributed randomly in a compound represented by $Bi_{1-x}M_xCu_{u-w}T_wO_{a-y}Q1_yTe_bSe_z$.

Here, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements, for example, a group of Ag, Co, Ni, Zn, Au, Pd, Pt, $Ag_2Te$, CuTe, $Cu_2Se$, $Bi_2Te_3$ and CuAgSe; and $0 \leq x < 1$, $0.5 \leq u \leq 1.5$, $0 \leq w \leq 1$, $0.2 < a < 1.5$, $0 \leq y < 1.5$, $0 \leq b < 1.5$ and $0 \leq z < 1.5$.

On the other hand, that A particles are distributed randomly means that a distance between A particles comprised in a material represented by $Bi_{1-x}M_xCu_{u-w}T_wO_{a-y}Q1_yTe_bSe_z$ is nonuniform.

Preferably, the A particles can have a particle size of 5 nm (nanometer) to 100 um (micrometer)

FIG. 1 is a schematic flowchart for a method of manufacturing a compound semiconductor according to one aspect of the present disclosure.

Referring to FIG. 1, a method of manufacturing a compound semiconductor according to one aspect of the present disclosure comprises the steps of: preparing a material represented by a chemical formula of $Bi_{1-x}M_xCu_{u-w}T_wO_{a-y}Q1_yTe_bSe_z$ S110; producing a mixture by adding A to the prepared material represented by $Bi_{1-x}M_xCu_{u-w}T_wO_{a-y}Q1_yTe_bSe_z$ S120; and sintering the mixture S130.

Preferably, the S110 step mixes powders of $Bi_2O_3$, Bi, Cu and T (one or more elements selected from transition metal elements) and optionally further mixes powders of one or more among M (one or more elements selected from the group consisting of Ba, Sr, Ca, Mg, Cs, K, Na, Cd, Hg, Sn, Pb, Mn, Ga, In, Tl, As and Sb, or oxides thereof), Q1 (one or more among S, Se, As and Sb), Te, and Se, and then performs thermal treatment.

Preferably, A added in the S120 step can include transition metal and/or transition metal-Group VI element compounds which, when being placed with in a matrix of $[Bi_{1-x}M_xCu_{u-w}T_wO_{a-y}Q1_yTe_bSe_z]$, exhibit thermodynamical stability in phase and form, lower the lattice thermal conductivity of the matrix and have electrical conductivity higher than the matrix. Also, A added in the S120 step can include transition metals which can induce the generation of transition metal-Group VI element compounds having such characteristics within a matrix of $[Bi_{1-x}M_xCu_{u-w}T_wO_{a-y}Q1_yTe_bSe_z]$.

More preferably, the S120 step can add 20 mol % or less of one or more among Ag, Co, Ni, Zn, Au, Pd, Pt, $Ag_2Te$, CuTe, $Cu_2Se$, $Bi_2Te_3$ and CuAgSe, in comparison to $Bi_{1-x}M_xCu_{u-w}T_wO_{a-y}Q1_yTe_bSe_z$. Ag, Co, Ni, Zn, Au, Pd, Pt, $Ag_2Te$, CuTe, $Cu_2Se$, $Bi_2Te_3$ and CuAgSe can enhance the thermoelectric conversion performance of a compound semiconductor according to the present disclosure when being added to $Bi_{1-x}M_xCu_{u-w}T_wO_{a-y}Q1_yTe_bSe_z$ within such a range.

More preferably, the S120 step can add 5 mol % or less of one or more among Ag, Co, Ni, Zn, Au, Pd, Pt, $Ag_2Te$, CuTe, $Cu_2Se$, $Bi_2Te_3$ and CuAgSe, in comparison to $Bi_{1-x}M_xCu_{u-w}T_wO_{a-y}Q1_yTe_bSe_z$.

Also preferably, Ag, Co, Ni, Zn, Au, Pd, Pt, $Ag_2Te$, CuTe, $Cu_2Se$, $Bi_2Te_3$ and CuAgSe added in the S120 step can have an initial particle size of 5 nm to 100 um. As a particle size of particles being added as A becomes closer to 5 nm, electrical conductivity can be reduced less than thermal conductivity, and it is thus advantageous in enhancing the thermoelectric performance of a compound semiconductor according to the present disclosure. On the other hand, as a particle size of particles being added becomes larger, the crystal phase and form of particles can be more stable, and it is thus advantageous in the performance enhancement and control of a compound semiconductor. Given all such considerations, in order to manufacture a compound semiconductor with optimal performance, it is preferable to choose a particle size of particles being added within the above range according to a composition of $[Bi_{1-x}M_xCu_{u-w}T_wO_{a-y}Q1_yTe_bSe_z]A_c$.

On the other hand, the S120 step can mix $Bi_{1-x}M_xCu_{u-w}T_wO_{a-y}Q1_yTe_bSe_z$ with A (Ag, Co, Ni, Zn, Au, Pd, Pt, $Ag_2Te$, CuTe, $Cu_2Se$, $Bi_2Te_3$ and CuAgSe) by hand milling using mortar, ball milling, planetary ball milling and the like; however, the present disclosure is not limited to such particular mixing methods.

Also preferably, the S130 step can be performed by a spark plasma sintering (SPS) method or a hot press (HP) method. While thermoelectric performance can differ depending on sintering methods even in identical thermoelectric materials, a compound semiconductor according to the present disclosure can exhibit more enhanced thermoelectric performance when being sintered by such pressing sintering methods.

Preferably, the pressing sintering step S130 can be performed under pressure conditions of 30 MPa to 200 MPa. Preferably, the pressing sintering step S130 can be performed under temperature conditions of 400° C. to 700° C. And, the pressing sintering step S130 can be performed for 1 minute to 12 hours under the pressure and temperature conditions.

While compound semiconductors may exhibit different thermoelectric performance according to manufacturing methods, it is preferable that a compound semiconductor according to the present disclosure is manufactured by a method of manufacturing a compound semiconductor as described above. In this case, high ZT can be ensured for compound semiconductors, and it can be advantageous particularly in ensuring a high ZT within a temperature range of 100° C. to 600° C.

However, the present disclosure is not limited to such a manufacturing method, and a compound semiconductor represented by the chemical formula 1 can be manufactured by other manufacturing methods.

Figure 2:
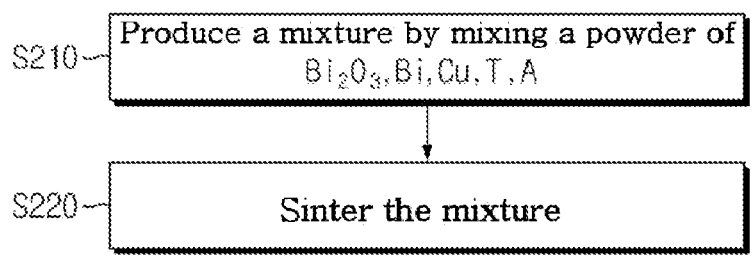
FIG. 2 is a schematic flowchart for a method of manufacturing a compound semiconductor according to another aspect of the present disclosure.
Figure 3:
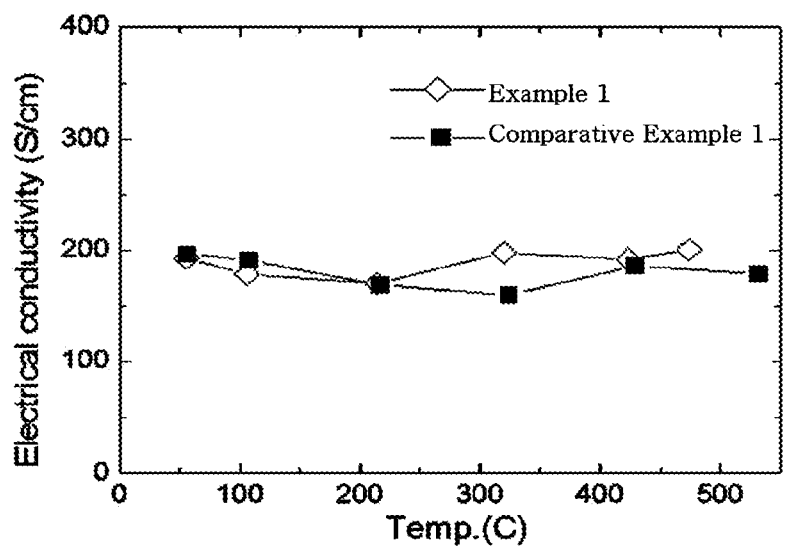
FIG. 3 is a graph of electrical conductivity depending on temperature change in a compound semiconductor of Example 1 manufactured according to the present disclosure and in that of Comparative Example 1.
Figure 4:
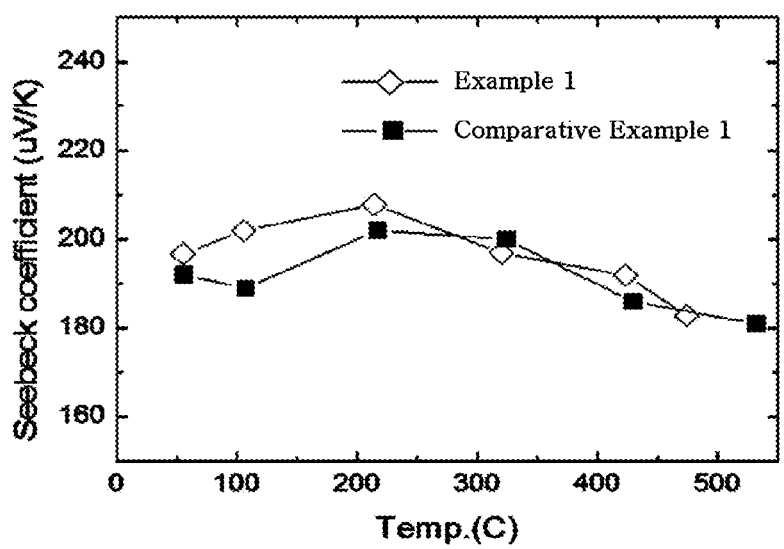
FIG. 4 is a graph of Seebeck coefficient depending on temperature change in a compound semiconductor of Example 1 manufactured according to the present disclosure and in that of Comparative Example 1.
Figure 5:
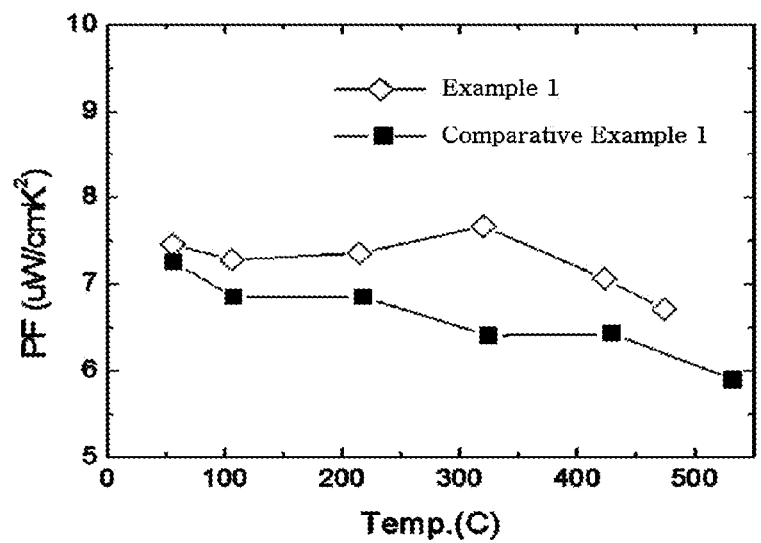
FIG. 5 is a graph of power factor depending on temperature change in a compound semiconductor of Example 1 manufactured according to the present disclosure and in that of Comparative Example 1.

FIG. 2 is a schematic flowchart for a method of manufacturing a compound semiconductor according to another aspect of the present disclosure.

Referring to FIG. 2, a method of manufacturing a compound semiconductor according to another aspect of the present disclosure can comprise the steps of: mixing powders of $Bi_2O_3$, Bi, Cu, T (one or more elements selected from transition metal elements) and A (one or more selected from the group consisting of transition metal elements and transition metal-Group VI element compounds) (S210); and sintering the mixture (S220).

Here, the S210 step can optionally further mix one or more powders selected from M (one or more elements selected from the group consisting of Ba, Sr, Ca, Mg, Cs, K, Na, Cd, Hg, Sn, Pb, Mn, Ga, In, Tl, As and Sb, or oxides thereof), Q1 (one or more elements selected from the group consisting of S, Se, As and Sb), Te, and Se, thereby producing a mixture.

A manufacturing method according to such aspects of the present disclosure manufactures by mixing A directly with a raw material making up $Bi_{1-x}M_xCu_{u-w}T_wO_{a-y}Q1_yTe_bSe_z$ and then sintering the mixture, rather than by manufacturing a sintered material represented by $Bi_{1-x}M_xCu_{u-w}T_wO_{a-y}Q1_yTe_bSe_z$, adding and mixing A (Ag, Co, Ni, Zn, Au, Pd, Pt, $Ag_2Te$, CuTe, $Cu_2Se$, $Bi_2Te_3$ and CuAgSe) with the sintered material, and then sintering the resultant material. In other words, according to such aspects of the present disclosure, a step of additionally preparing a sintered material represented by $Bi_{1-x}M_xCu_{u-w}T_wO_{a-y}Q1_yTe_bSe_z$ can be excluded from a manufacturing method.

A thermoelectric conversion device according to the present disclosure can include a compound semiconductor described above. In other words, a compound semiconductor according to the present disclosure can be used as a thermoelectric conversion material in thermoelectric conversion devices. Especially, a thermoelectric conversion device according to the present disclosure can include a compound semiconductor described above, as a p-type thermoelectric material.

A compound semiconductor according to the present disclosure exhibits high ZT, which is a figure of merit of a thermoelectric conversion material, as well as high Seebeck coefficient and electrical conductivity and low thermal conductivity, thereby providing superior thermoelectric conversion performance. Therefore, a compound semiconductor according to the present disclosure can be employed usefully in thermoelectric conversion devices, in place of conventional thermoelectric conversion materials, or in addition to conventional compound semiconductors.

Also, a compound semiconductor according to the present disclosure can be applied in a bulk-type thermoelectric conversion material. In other words, a bulk-type thermoelectric conversion material according to the present disclosure can include a compound semiconductor described above.

Also, a solar cell according to the present disclosure can include a compound semiconductor described above. In other words, a compound semiconductor according to the present disclosure can be used as in solar cells, especially in a light absorbing layer therein.

Solar cells can be manufactured in a structure in which a front surface transparent electrode, a buffer layer, a light absorbing layer, a rear surface electrode and a substrate are stacked sequentially first from where sunlight is incident upon. A substrate positioned in the bottom portion can be formed in glass, and a rear surface electrode formed thereon can be formed by depositing metals such as Mo.

In turn, a compound semiconductor according to the present disclosure is stacked on an upper portion of a rear surface electrode, by an electron beam deposition method, a sol-gel method, a pulsed laser deposition (PLD) method or the like, forming the light absorbing layer. On an upper portion of the light absorbing layer, there can exist a buffer layer which buffers differences in lattice constant and bandgap between a ZnO layer used as an front surface transparent electrode and the light absorbing layer; such a buffer layer can be formed by depositing materials such as CdS through a chemical bath deposition (CBD) method or the like. Then, on a buffer layer, a front surface transparent electrode can be formed by a sputtering method or the like, as a stacked layer of ZnO or of ZnO and ITO.

A solar cell according to the present disclosure can be modified in various forms. For example, it is possible to manufacture stacked solar cells in which solar cells using a compound semiconductor according to the present disclosure as a light absorbing layer are stacked. And other solar cells stacked thereby can use solar cells using silicon or other known compound semiconductors.

Also, it is possible to stack a plurality of solar cells using compound semiconductors with different bandgap as a light absorbing layer by modifying the bandgap of compound semiconductors according to the present disclosure. The bandgap of compound semiconductors according to the present disclosure can be controlled by modifying the composition ratio of constituent elements (for example, Te) making up such compound semiconductors.

Also, a compound semiconductor according to the present disclosure can be applied in IR windows, IR sensors or the like through which infrared can optionally pass.

Hereinafter, for more specified description, the present disclosure will be described in detail with reference to Examples and Comparative Examples. However, the Examples according to the present disclosure can be modified in various forms, and the scope of the present disclosure is not to be construed as being limited to the Examples described below. The Examples according to the present disclosure are provided in order to give more complete description of the present disclosure to those having average knowledge in the art.

Comparative Example 1

In order to synthesize BiCuOTe, 21.7 g of $Bi_2O_3$ (Aldrich, 99.9%, 10 um), 9.7 g of Bi (5N+, 99.999%, shot), 8.9 g of Cu (Aldrich, 99.7%, 3 um), and 17.8 g of Te (5N+, 99.999%, shot) are mixed properly using agate mortar. The mixed materials are put in a silica tube and vacuum-sealed, and heated under a temperature of 500° C. for 12 hours. As a result, a powder of BiCuOTe is obtained. By analyzing X-ray diffraction patterns of the sample being thermally treated, a material obtained by the Comparative Example 1 is identified to be BiCuOTe.

Comparative Example 2

In order to synthesize $Bi_{0.95}Pb_{0.05}CuOSe$, 2.589 g of $Bi_2O_3$ (Aldrich, 99.9%, 10 um), 0.987 g of Bi (5N+, 99.999%, shot), 0.173 g of Pb(Alfa Aesar, 99.9%, 200 mesh), 1.059 g of Cu (Aldrich, 99.7%, 3 urn), and 1.316 g of Se (5N+, 99.999%, shot) are mixed properly using agate mortar. The mixed materials are put in a silica tube and vacuum-sealed, and heated under a temperature of 600° C. for 12 hours. As a result, a powder of $Bi_{0.95}Pb_{0.05}CuOSe$ is obtained.

Example 1

BiCuOTe is synthesized in the same method as in Comparative Example 1. Then, respective powders are weighed to agree with the composition of $[BiCuOTe][Ag_{0.01}]$ and subject to wet $ZrO_2$ ball milling for 12 hours. As a result, a mixture is manufactured. Ag particles being used have a particle size of 100 nm.

Examples 2 and 3

$Bi_{0.95}Pb_{0.05}CuOSe$ is synthesized in the same method as in Comparative Example 2. Then, respective powders are weighed to agree with the composition of $[Bi_{0.95}Pb_{0.05}CuOSe][Ag_{0.02}]$ and subject to wet $ZrO_2$ ball milling for 12 hours. As a result, a mixture is manufactured. In Example 2 and 3, the compositions are identical, but Ag particles being used have different particle sizes, respectively, 20 nm and 45 um.

Example 4

$Bi_{0.95}Pb_{0.05}CuOSe$ is synthesized in the same method as in Comparative Example 2. Then, respective powders are weighed to agree with the composition of $[Bi_{0.95}Pb_{0.05}CuOSe][Co_{0.03}]$ and subject to wet $ZrO_2$ ball milling for 12 hours. As a result, a mixture is produced. Here, Co particles being used have a particle size of 30 um.

A portion of each sample, synthesized by the above-mentioned methods, of Comparative Examples and Examples are respectively arranged at a graphite mold with a diameter of 12 mm, and pressurized under a pressure of 50 MPa using SPS. And, for 5 minutes, samples in Comparative Example 1 and Example 1 are sintered under a temperature of 500° C., and samples in Comparative Example 2 and Example 2 to 4 are sintered under a temperature of 600° C.

Figure 6:
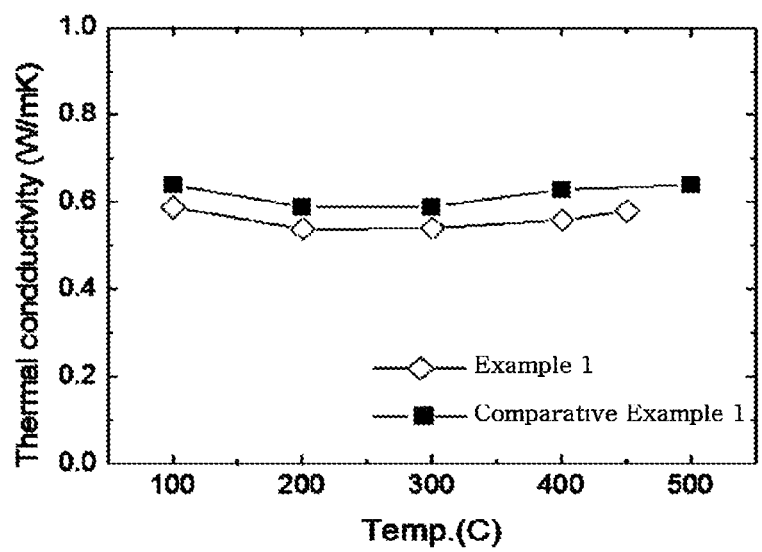
FIG. 6 is a graph of thermal conductivity depending on temperature change in a compound semiconductor of Example 1 manufactured according to the present disclosure and in that of Comparative Example 1.
Figure 7:
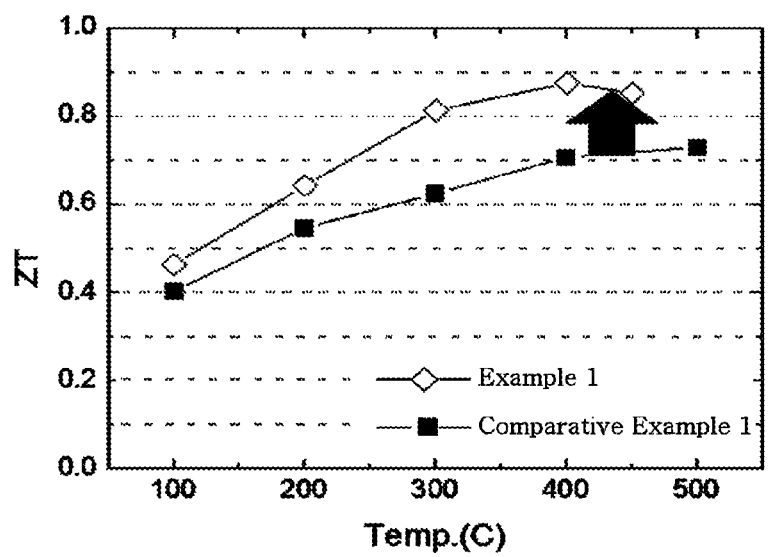
FIG. 7 is a graph of ZT depending on temperature change in a compound semiconductor of Example 1 manufactured according to the present disclosure and in that of Comparative Example 1.
Figure 8:
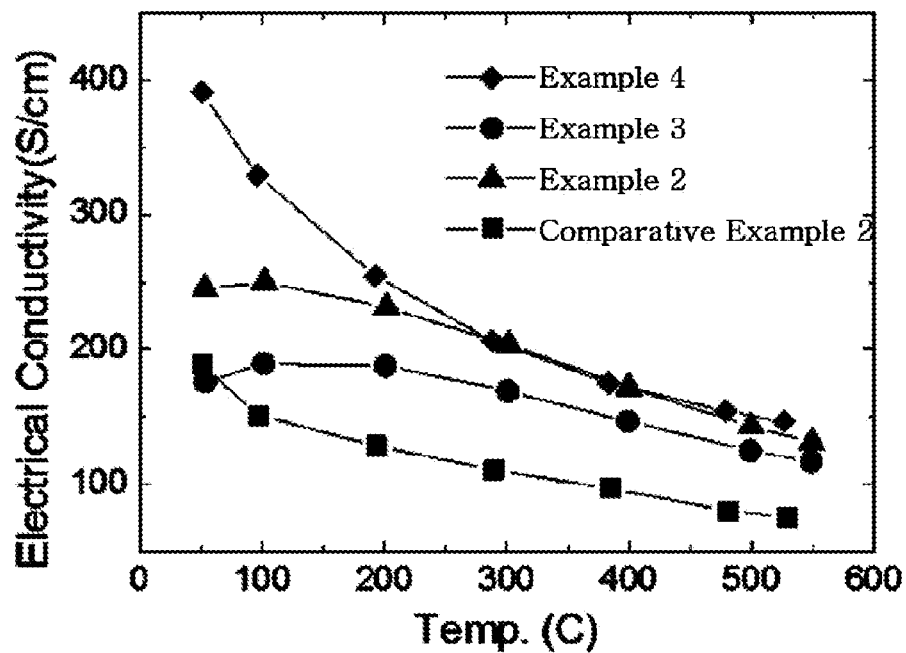
FIG. 8 is a graph of electrical conductivity depending on temperature change in compound semiconductors of Examples 2 to 4 manufactured according to the present disclosure and in that of Comparative Example 2.
Figure 9:
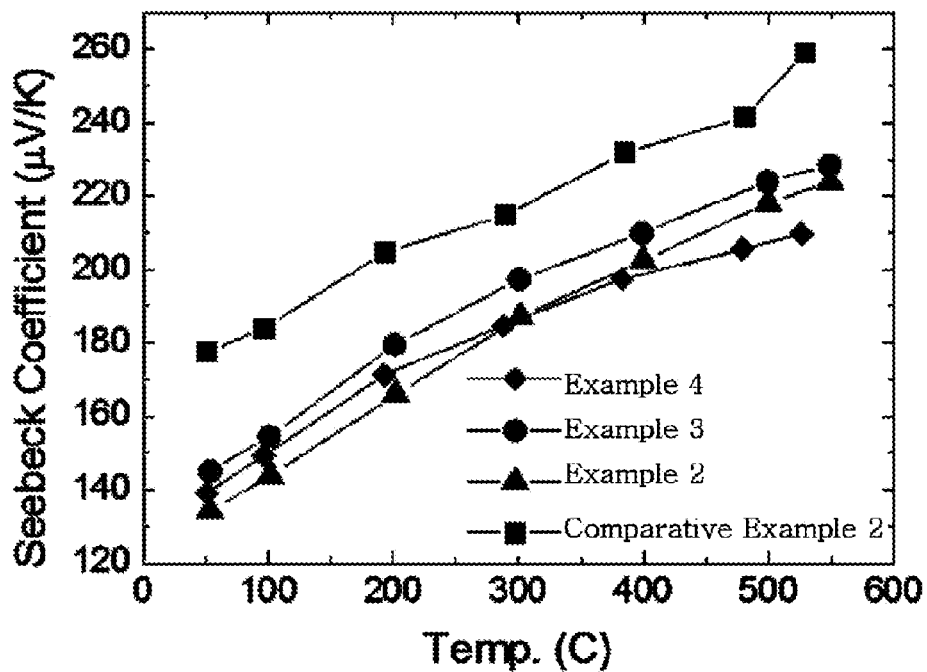
FIG. 9 is a graph of Seebeck coefficient depending on temperature change in compound semiconductors of Examples 2 to 4 manufactured according to the present disclosure and in that of Comparative Example 2.
Figure 10:
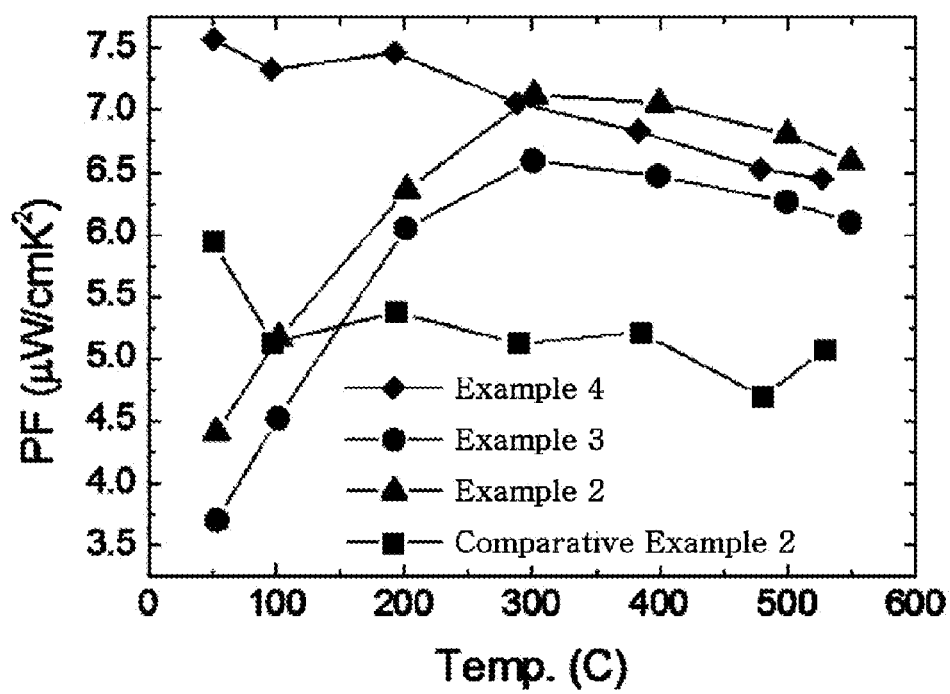
FIG. 10 is a graph of power factor depending on temperature change in compound semiconductors of Examples 2 to 4 manufactured according to the present disclosure and in that of Comparative Example 2.
Figure 11:
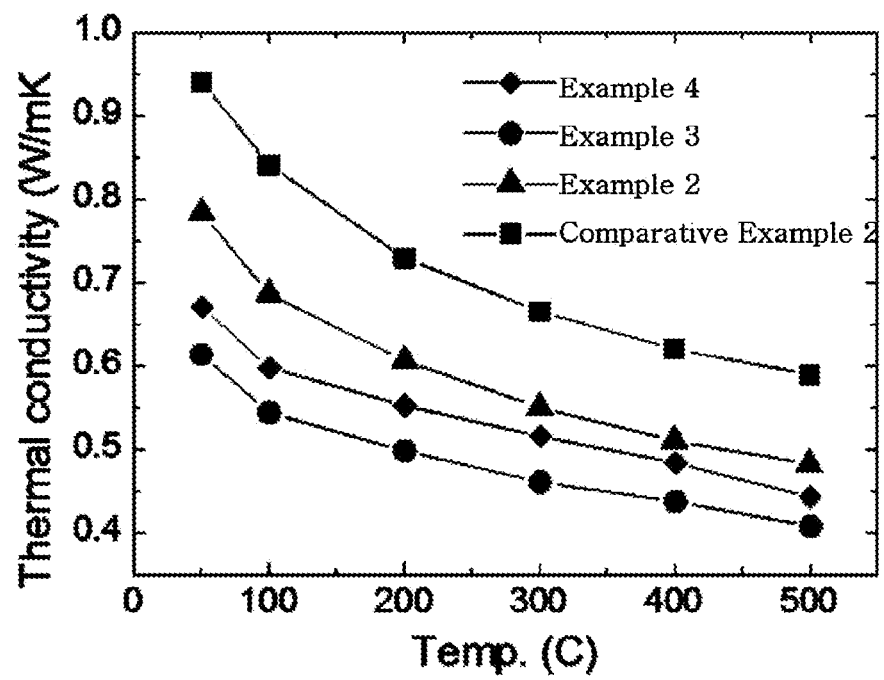
FIG. 11 is a graph of thermal conductivity depending on temperature change in compound semiconductors of Examples 2 to 4 manufactured according to the present disclosure and in that of Comparative Example 2.
Figure 12:
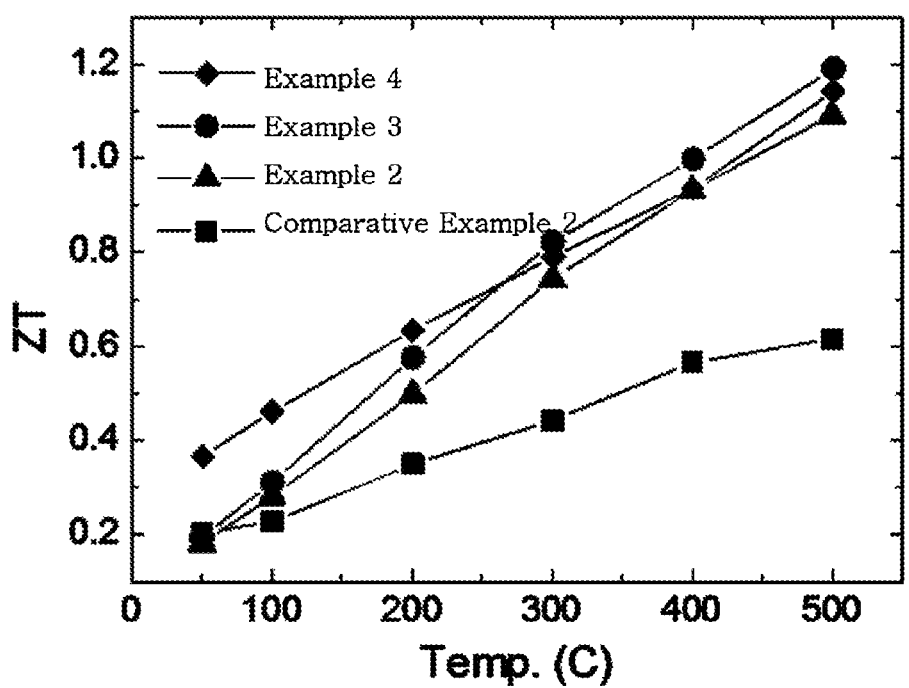
FIG. 12 is a graph of ZT depending on temperature change in compound semiconductors of Examples 2 to 4 manufactured according to the present disclosure and in that of Comparative Example 2.

Then, respectively for each sintered sample as described above, electrical conductivity and Seebeck coefficient are measured for predetermined temperature intervals using ZEM-3 (Ulvac-Rico, Inc.), and power factor (PF) is calculated accordingly. The results are shown in FIGS. 3 to 5 and FIGS. 8 to 10. Also, for each sample, thermal conductivity is measured using LFA457 (Netch). The results are shown in FIGS. 6 and 11. Then, through the measured values obtained thereby, ZT, which is a figure of merit for thermoelectric conversion, is confirmed. The results are shown in FIGS. 7 and 12. In other words, FIGS. 3 to 7 show the measurement and confirmation results for Comparative Example 1 and Example 1, while FIGS. 8 to 12 show the measurement and confirmation results for Comparative Example 2 and Examples 2 to 4.

First, referring FIGS. 3 to 7, it can be known that a compound of Example 1 ($[BiCuOTe][Ag_{0.01}]$) shows electrical conductivity and Seebeck coefficient maintained or increased depending on a range of temperature and thermal conductivity decreased for the whole of a range of measurement temperature, compared to a compound of Comparative Example 1 (BiCuOTe). And it can be known through such results that ZT for a compound semiconductor of Example 1 is increased significantly.

Then, referring to FIGS. 8 to 12, it can be known that compounds of Examples 2 to 4($[Bi_{0.95}Pb_{0.05}CuOSe][Ag_{0.02}]$, $[Bi_{0.95}Pb_{0.05}CuOSe][Co_{0.03}]$) shows electrical conductivity increased significantly and Seebeck coefficient decreased significantly, compared to a compound of Comparative Example 2 ($Bi_{0.95}Pb_{0.05}CuOSe$). Especially, it is confirmed that compound semiconductors of Examples 2 and 3 show PF significantly increased for a temperature of 200° C. or more, and that a compound semiconductor of Example 4 shows PF increased significantly for the whole of a range of measurement temperature. Also, it can be known that thermal conductivity for compound semiconductors of Examples 2 to 4 is decreased significantly for the whole of a range of measurement temperature, compared to a compound semiconductor of Comparative Example 2. And it can be known through such results that ZT for compound semiconductors of Examples 2 to 4 of the present disclosure is increased significantly, compared to a compound semiconductor of Comparative Example 2.

Therefore, summing up all such results, it can be known that a compound semiconductor according to the present disclosure exhibits thermoelectric conversion performance superior to conventional compound semiconductors in various aspects.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A compound semiconductor represented by the following chemical formula 1:

$[Bi_{1-x}M_xCu_{u-w}T_wO_{a-y}Q1_yTe_bSe_z]A_c$      <Chemical formula 1> where, in the chemical formula 1, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x<1$, $0.5 \leq u \leq 1.5$, $0 \leq w \leq 1$, $0.2<a<1.5$, $0 \leq y<1.5$, $0 \leq b<1.5$, $0 \leq z<1.5$ and $0<c<0.2$, wherein A is one or more elements selected from the group consisting of Ag, Co, Ni, Zn, Au, Pd, Pt, $Ag_2Te$, $CuTe$, $Cu_2Se$, $Bi_2Te_3$ and CuAgSe.

2. The compound semiconductor of claim 1, wherein c in the chemical formula 1 satisfies $0<c<0.05$.

3. The compound semiconductor of claim 1, wherein x, y and z in the chemical formula 1 respectively satisfy x=0, y=0 and z=0.

4. The compound semiconductor of claim 1, wherein w, y, b and z in the chemical formula 1 respectively satisfy w=0, y=0, b=0 and z=1.

5. The compound semiconductor of claim 1, wherein the chemical formula 1 is represented by $[Bi_{1-x}M_xCuOSe]A_c$.

6. A compound semiconductor in which A particles are distributed randomly in a compound represented by $Bi_{1-x}M_xCu_{u-w}T_wO_{a-y}Q1_yTe_bSe_z$, wherein M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; and $0 \leq x<1$, $0.5 \leq u \leq 1.5$, $0 \leq w \leq 1$, $0.2<a<1.5$, $0 \leq y<1.5$, $0 \leq b<1.5$ and $0 \leq z<1.5$, wherein A is one or more elements selected from the group consisting of Ag, Co, Ni, Zn, Au, Pd, Pt, $Ag_2Te$, $CuTe$, $Cu_2Se$, $Bi_2Te_3$ and CuAgSe.

7. A thermoelectric conversion device comprising a compound semiconductor according to claim 1.

8. The thermoelectric conversion device of claim 7, comprising a compound semiconductor according to claim 1 as a p-type thermoelectric conversion material.

9. A solar cell comprising a compound semiconductor, the compound semiconductor represented by the following chemical formula 1:

$[Bi_{1-x}M_xCu_{u-w}T_wO_{a-y}Q1_yTe_bSe_z]A_c$      <Chemical formula 1> where, in the chemical formula 1, M is one or more elements selected from the group consisting of Ba, Sr, Ca, Mg, Cs, K, Na, Cd, Hg, Sn, Pb, Mn, Ga, In, Tl, As and Sb; Q1 is one or more elements selected from the group consisting of S, Se, As and Sb; T is one or more elements selected from transition metal elements; A is one or more elements selected from the group consisting of transition metal elements and compounds of transition metal elements and group VI elements; and $0 \leq x<1$, $0.5 \leq u \leq 1.5$, $0 \leq w \leq 1$, $0.2<a<1.5$, $0 \leq y<1.5$, $0 \leq b<1.5$, $0 \leq z<1.5$ and $0<c<0.2$.

10. A bulk thermoelectric material comprising a compound semiconductor according to claim 1.

* * * * *